United States Patent [19]
Gardner et al.

[11] Patent Number: 5,937,308
[45] Date of Patent: Aug. 10, 1999

[54] SEMICONDUCTOR TRENCH ISOLATION STRUCTURE FORMED SUBSTANTIALLY WITHIN A SINGLE CHAMBER

[75] Inventors: Mark I. Gardner, Cedar Creek; Mark C. Gilmer, Austin, both of Tex.

[73] Assignee: Advanced Micro Devices, Inc.

[21] Appl. No.: 08/824,830

[22] Filed: Mar. 26, 1997

[51] Int. Cl.⁶ .................................................. H01L 21/76
[52] U.S. Cl. ........................ 438/424; 438/460; 438/437; 148/DIG. 33.3; 148/50
[58] Field of Search ................................. 438/424, 427, 438/435, 437, 296, 913, 400; 148/DIG. 50, DIG. 33.3

[56] References Cited

U.S. PATENT DOCUMENTS

| | | | |
|---|---|---|---|
| 4,876,216 | 10/1989 | Tobias et al. | 438/437 |
| 4,951,601 | 8/1990 | Maydan et al. | |
| 5,426,076 | 6/1995 | Moghadam | 438/913 |
| 5,433,794 | 7/1995 | Fazan et al. | 148/33.3 |
| 5,445,989 | 8/1995 | Lur et al. | 438/425 |
| 5,498,577 | 3/1996 | Fulford, Jr. et al. | 438/203 |
| 5,498,578 | 3/1996 | Steele et al. | 438/400 |
| 5,589,233 | 12/1996 | Law et al. | 427/579 |
| 5,609,737 | 3/1997 | Fukui et al. | 204/192.12 |
| 5,652,166 | 7/1997 | Sun et al. | 438/229 |
| 5,696,019 | 12/1997 | Chang | 148/DIG. 50 |

FOREIGN PATENT DOCUMENTS 4-177735  6/1992  Japan.

OTHER PUBLICATIONS

High Technology manufacturing . . . E L Hu Emerging Technologies for In Situ Processing. Proceedings of the NATO Advanced Research Workshop, 1988.

*Primary Examiner*—Charles Bowers
*Assistant Examiner*—David S. Blum
*Attorney, Agent, or Firm*—Kevin L. Daffer; Robert C. Kowert; Conley, Rose & Tayon

[57] ABSTRACT

A substantially in situ trench isolation process is provided. The process includes forming a trench regions between active regions in a semiconductor substrate. The semiconductor substrate may be covered with a protective oxide pad and/or nitride layer. In a single chamber, an oxide is thermally grown in the trench, the nitride layer is substantially stripped, and a fill dielectric is deposited in the trench and over the active and trench regions. The invention contemplates thermal growth, etch, and deposition processes to be performed serially in a single chamber without opening the chamber. The invention further contemplates modifying or adapting a conventional process chamber to all for the in situ processing of thermal growth, etch, and deposition processes. Alternatively, a specialized chamber may be provided.

7 Claims, 4 Drawing Sheets

SEMICONDUCTOR TRENCH ISOLATION STRUCTURE FORMED SUBSTANTIALLY WITHIN A SINGLE CHAMBER

BACKGROUND OF THE INVENTION

1. Field of the Invention

This invention relates to semiconductor fabrication and more particularly to an improved process of isolating active regions within a semiconductor substrate. The improved isolation process involves etching trenches between active regions, and then by a series of in situ processes, creating a fill dielectric within the trenches.

2. Description of the Relevant Art

The fabrication of an integrated circuit involves placing numerous devices in a single semiconductor substrate. Select devices are interconnected by a conductor which extends over a dielectric which separates or "isolates" those devices. Implementing an electrical path across a monolithic integrated circuit thereby involves selectively connecting isolated devices. When fabricating integrated circuits it must therefore be possible to isolate devices built into the substrate from one another. From this perspective, isolation technology is one of the critical aspects of fabricating a functional integrated circuit.

A popular isolation technology used for an MOS integrated circuit involves the process of locally oxidizing silicon. Local oxidation of silicon, or LOCOS involves oxidizing field regions between devices. The oxide grown in field regions are termed field oxide, wherein field oxide is grown during the initial stages of integrated circuit fabrication, before source and drain implants are placed in device areas or active areas. By growing a thick field oxide in isolation (or field) regions pre-implanted with a channel-stop dopant, LOCOS processing serves to prevent the establishment of parasitic channels in the field regions. While LOCOS has remained a popular isolation technology, there are several problems inherent with LOCOS. First, a growing field oxide extends entirely across the field region and laterally as a bird's-beak structure. In many instances, the bird's-beak structure can unacceptably encroach into the device active area. Second, the pre-implanted channel-stop dopant oftentimes redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect therefore occurs. Field-oxide-thinning produces Is problems with respect to field threshold voltages, interconnect-to-substrate capacitance, and field-edge leakage in small field regions between closely spaced active areas.

Many of the problems associated with LOCOS technology are alleviated by an isolation technique known as the "shallow trench process". Despite advances made to decrease bird's-beak, channel-stop encroachment and non-planarity, it appears that LOCOS technology is still inadequate for deep submicron MOS technologies. The shallow trench process is better suited for isolating densely spaced active devices having field regions less than one micron in lateral dimension.

The trench process involves the steps of etching a silicon substrate surface to a relatively shallow depth, e.g., between 0.2 to 0.5 microns, removing away the trench mask layer and any protective layer (such as a nitride layer), and then refilling the shallow trench with a deposited dielectric. After the trench is filled, it is then planarized to complete the isolation structure.

One problem with the aforedescribed trench process is that the active areas are exposed along the trench walls during the process of removing the trench mask and nitride layer. Removal of the trench mask and nitride may involve a wet etch process that may result in contamination of the active areas along the trench walls. To avoid exposing the sidewalls of the active area, a thin thermally-grown oxide may be created to line the trenches and serve as an etch stop along the active area sidewalls.

A further problem with the "shallow trench process" is that it involves numerous process steps in varying chambers, thereby complicating the overall semiconductor fabrication process. For example, the process may involve transporting wafers from a plasma etch chamber for forming the trenches to a thermal oxidation chamber for growing the thin protective oxide. The wafers are then transported again to an etch chamber for removal of the trench mask and nitride layer. This may be followed by placing the topography into a chemical vapor deposition (CVA) chamber for deposition of the fill dielectric. After the fill dielectric is deposited, the wafers are again moved to a chemical mechanical polish (CMP) chamber or alternatively a plasma etch-back chamber for planarization.

The complexity of the "shallow trench isolation" process may decrease the overall throughput of the semiconductor fabrication process. The time spent transporting wafers between the various chambers may amount to a significant portion of the overall process time. Thus, the "shallow trench isolation" process may be detrimental to fabrication efficiency, thereby increasing fabrication cost. Furthermore, transportation of the wafers between the various process chambers required for the "shallow trench isolation" process may expose the wafers to contaminants both inside and outside the various chambers. Also, the transferal of wafers between the various chambers employed in the above process may result in thermal stress when wafers are removed from a warm chamber to ambient conditions. Also, the risk of physical damage to the wafers increases when the wafers are transported.

While the trench isolation process has many advantages over LOCOS, it still may have detrimental effects on overall process efficiency and may result in wafers being exposed to contaminants and other risks. A need therefore exists in producing a process which can utilize the advantages of shallow trench isolation but with improved efficiency and less exposure to contaminants and other risks outside the reaction chambers. Thus, it is desirable to have a process that is capable of forming isolation trenches between active areas and filling the isolation trenches with a fill dielectric. It is further desirable that the process does not have a detrimental effect on the active area sidewalls. It is also desirable that the process have improved efficiency and less exposure to contaminants and thermal or physical stress outside reaction chambers. Thus, it would be beneficial to employ a "shallow trench isolation" process with reduced cost and cycle time compared to a conventional "shallow trench isolation" process. The desirous process must be cleaner and safer than conventional shallow trench isolation processes.

SUMMARY OF THE INVENTION

The problems outlined above are in large part solved by an improved shallow trench process and processing chamber of the present invention. The improved process hereof serves to form trench isolation regions between active regions by a substantially in situ process, i.e. a process performed substantially in a single chamber without opening the chamber in the interim.

The invention contemplates a process for creating a trench isolation structure to isolate semiconductor devices formed in active regions of a semiconductor substrate. The process may include providing a semiconductor substrate on which a pad oxide layer is grown or deposited and a nitride layer has been formed. A photoresist layer is patterned and polymerized to form a trench mask. A removal process removes the nitride, pad oxide and a portion of the substrate in the open trench regions defined by the trench mask. The photoresist trench mask is then stripped. It is understood that other materials beside photoresist may be used for the trench mask and the process adapted accordingly.

After removal of the trench mask, an oxide is thermally grown which lines the trench sidewalls. A rapid thermal anneal (RTA) process may be used to form the oxide liner. Some or all of the nitride layer and possibly some of the pad oxide layer is then stripped. A fill dielectric is then deposited in the trenches and over the trench regions and active regions. A TEOS LPCVD process may be used for the fill dielectric. The fill dielectric is then planarized by an etch or chemical mechanical polish (CMP) process. The nitride/pad oxide layers may serve as etchant/polish stops and may be partially removed in the planarization process. The planarization process results in a substantially planar surface with fill dielectric remaining substantially exclusively in the trenches. The result being localized trench isolation regions existing between active regions. Any remaining pad oxide may be removed to leave a silicon-based surface upon which and into which active or passive devices are formed.

Broadly speaking, the present invention contemplates that a substantial amount of the trench isolation process be performed in situ within a single chamber. Preferably, the thermal oxidation growth of the trench lining oxide, removal of the nitride layer, and deposition of fill dielectric occur in sequence within the single chamber. The invention further contemplates in situ processing of additional process steps as described herein.

The present invention also contemplates an in situ processing chamber for the trench isolation process. Modification of a conventional process chamber is provided to allow substantial in situ processing of numerous growth, deposition, and etch cycles involving trench isolation. For example, an oxidation or RTA furnace may be adapted to accept etchant and deposition gases. Plasma electrodes may be included to allow a dry plasma etch process used in forming the trenches. Other types of reactors, such as conventional CVD chamber or barrel reactors may also be adapted to the in situ trench isolation process of the present invention. Alternatively, a specialized, non-conventional chamber may be created to allow for serial in situ thermal oxidation, etch, and deposition processes. The basic reactor requirements for thermal oxidation, etch, and deposition processes are well known in the art. These requirements may be combined in a specialized or retrofitted single chamber as described hereinbelow.

According to the present invention, the thermal growth, etch, and deposition processes may therefore be performed in a single chamber without opening the chamber between deposition, growth, and etch cycles. Thus, the wafers are not frequently subjected to contaminants and thermal or physical stress outside the chamber, as in processes employing multiple chambers. Furthermore, the efficiency of the trench isolation process is enhanced because transportation time between chambers is largely eliminated.

BRIEF DESCRIPTION OF THE DRAWINGS

Other objects and advantages of the invention will become apparent upon reading the following detailed description and upon reference to the accompanying drawings in which.

Figure 1:
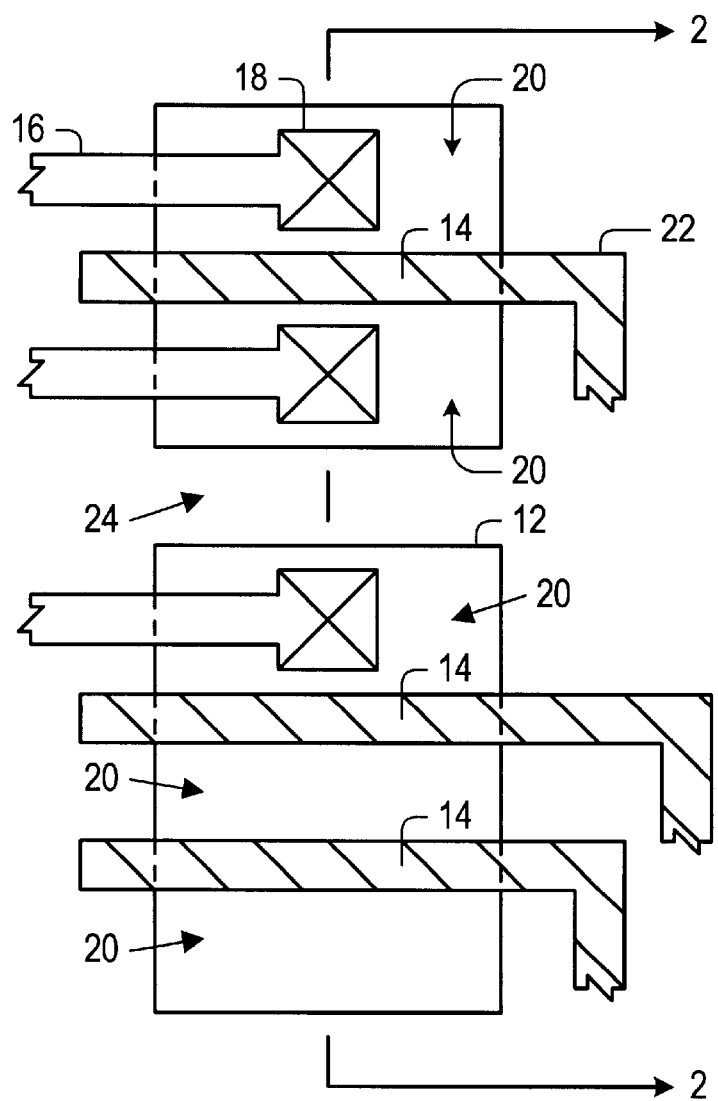
FIG. 1 is a partial overhead view of semiconductor devices formed in active regions isolated by a filled trench formed according to one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawing, FIG. 1 is a partial top plan view of semiconductor devices formed in active areas 12 and separated by trench region 24 formed according to one embodiment of the present invention. Trench region 24 serves to isolate the devices formed in active areas 12. After an isolation structure is formed in trench region 24 according to the in situ process describe infra, the semiconductor devices are formed in active regions 12. The semiconductor devices are created by forming a gate structure 14 between doped regions 20, typically according to a self-aligned process. The gate structures 14 include a gate oxide layer underneath (and thus not visible in FIG. 1) a polysilicon layer 22. The gate oxide is formed by growing or depositing a thin oxide layer on the active regions 12. Then polysilicon layer 22 is patterned over the gate oxide layer. Polysilicon 22 serves as the gate conductor in gate structure 14. As shown in FIG. 1, polysilicon 22 may extend past gate structure 14 to serve as a local interconnect. Also, other conductive materials, such as polymides, may be used as gate conductors and local interconnect.

Active regions 12 may have been implanted with a p-type dopant such as boron to form a p-well. Per a self-aligned process, an n-type dopant such as phosphorous may be implanted to form source/drain regions 20 in active region 12. An insulating oxide may be deposited over active regions 12 and contact windows (vias) 18 may be cut to create contact points to the semiconductor devices. Metal interconnect 16 may then be deposited to connect to source/drain regions 20 through contact windows 18. Metal interconnect 16 also may serve to connect the various semiconductor devices. More insulating and interconnect layers may be added in subsequent steps.

The process of creating semiconductor devices in active regions 12 as described above is meant to be illustrative of the type of process that may follow the in situ trench isolation process of the present invention. The aforedescribed process for creating semiconductor devices in active regions 12 is given in a simplified description. More complicated device processes, as understood in the art, may be used in conjunction with the present invention. For example, bipolar processes or more complicated MOS processes involving more steps may easily be used in conjunction with the in situ trench isolation process described infra.

Figure 2:
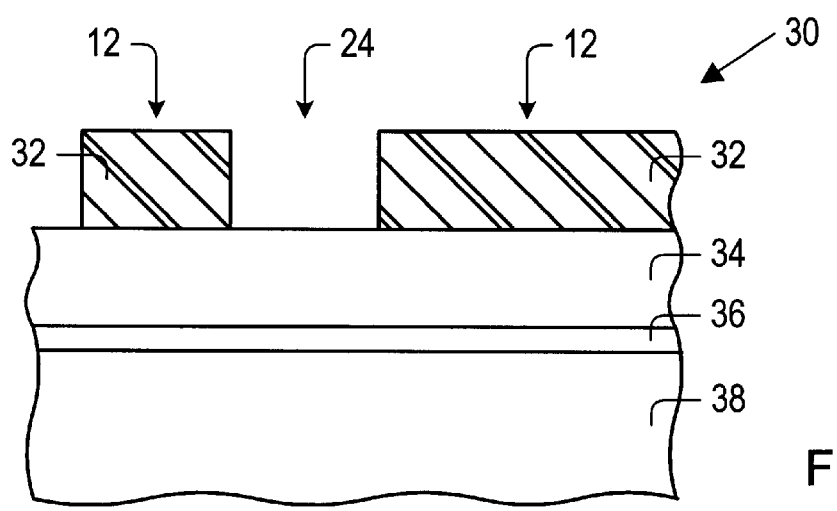
FIG. 2 is a partial cross-sectional view representing a processing step applied in the formation of the structure of FIG. 1, wherein a trench mask is patterned to define the trench regions.

Turning now to FIG. 2, a partial cross sectional view of a semiconductor topography 30 is illustrated. As indicated by the view lines 2—2 in FIG. 1, FIG. 2 represents a cross-section of trench region 24 and the active regions 12 upon which the semiconductor devices of FIG. 1 may later be formed. Semiconductor topography 30 may include any topography from which an integrated circuit such as a metal oxide semiconductor (MOS) may be fashioned. The semiconductor topography 30 shown in FIG. 2 includes a substrate 38, upon which a protective layer 36 is formed. Substrate 38 is preferably made from a single crystal silicon. Protective layer 36 comprises any material that protects the underlying silicon surface from subsequent processes such as etching and from stresses between the silicon substrate 38 and the substantially oxygen impermeable layer 34. For example, protective layer 36 may be a pad oxide layer. Formed over protective layer 36 is a substantially oxygen impermeable layer 34. Substantially oxygen impermeable layer 34 may be a silicon nitride ($Si_xN_y$) layer. Protective layer 36 and substantially oxygen impermeable layer 34 are hereinafter referred to as pad oxide layer 36 and nitride layer 34, respectively. Nitride layer 34 serves to prevent further oxide growth on substrate 38.

A trench mask layer 32 is deposited over nitride layer 34. The trench mask layer 32 is patterned to define trench region 24 and active regions 12, where the trench mask 32 covers active regions 12 and is open over trench region 24.. Trench mask layer 32 may be any material resistant to the trench-forming etch process described below. For example, trench mask layer 32 may be a photoresist layer. Hereinafter trench mask layer 32 will be referred to as photoresist layer 32. Photoresist layer 32 may be patterned by depositing a photoresist over nitride layer 34 and then selectively exposing areas of the photoresist to ultraviolet light. The exposed areas polymerize and become resistant to etching. The non-exposed areas are removed with an etchant or solvent, leaving the patterned photoresist layer shown in FIG. 2. Thus, photoresist layer 32 serves as a trench mask to allow etching in trench region 24 but prevent etching in active regions 12.

Figure 3:
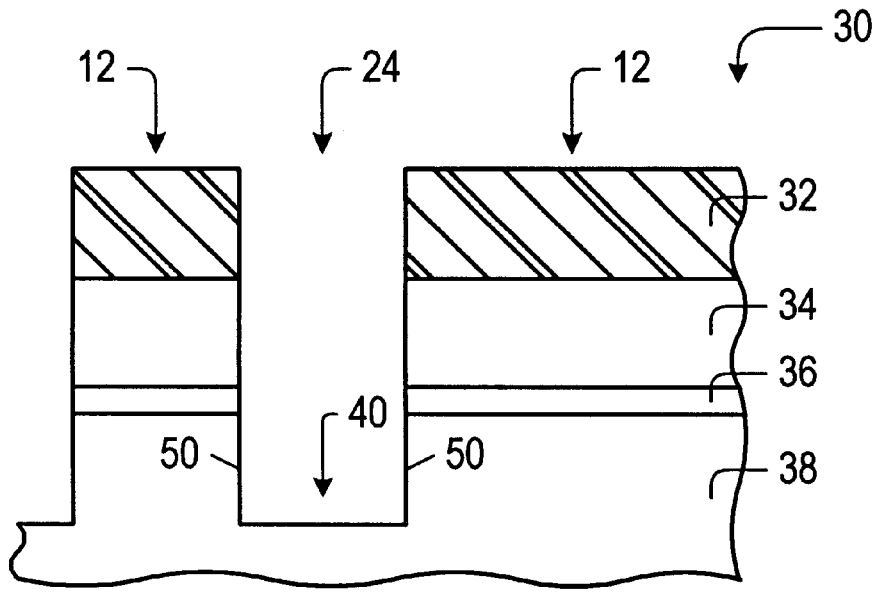
FIG. 3 represents a processing step showing the formation of trench regions of fixed, pre-defined width in the semiconductor substrate.

Thing now to FIG. 3, a process step subsequent to FIG. 2 is shown. The patterned photoresist layer 32 allows an etchant to remove the nitride layer 34, pad oxide 36, and a portion of substrate 38 in the trench region only. As described above, the photoresist layer 32 protects the active areas 12 from the etchant. The etchant may form a trench 40 approximately 0.2 to 1.0 microns, for example, into substrate 38. The etchant may be a wet etchant or preferably a plasma etchant. The etchant is selected to attack the nitride layer 34, pad oxide layer 36, and silicon substrate 38 in the trench region 24. Alternatively, a series of etchants may be used to attack the layers individually or in any combination as long as active areas 12 are protected by patterned photoresist layer 32.

Note that active regions 12 which are between trench regions 24 may be referred to as mesas or active mesas. Also trench regions, such as trench region 24 may be referred to as field regions or located in larger field regions. Thus trench regions 24, either individually or in conjunction with larger field regions, serve to separate active regions 12. Also, trench 40 in trench region 24 forms trench walls 50 which also correspond to the sidewalls of active regions 12.

Figure 4:
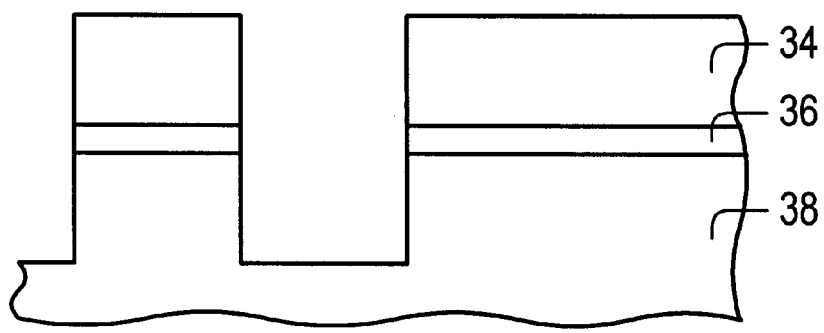
FIG. 4 represents a processing step showing the removal of the trench mask.

FIG. 4 illustrates a processing step subsequent to that shown in FIG. 3. FIG. 4 illustrates the removal of patterned photoresist layer 32. The removal process is selected to remove photoresist layer 32 without substantially attacking the other layers. Typically, a dry plasma etch in oxygen or a hot acid selective to the photoresist is used for removal. Various organic solvents may also be used in the photoresist stripping process. Nitride layer 34 and pad oxide layer 36 remain and serve to protect active regions 12.

Figure 5:
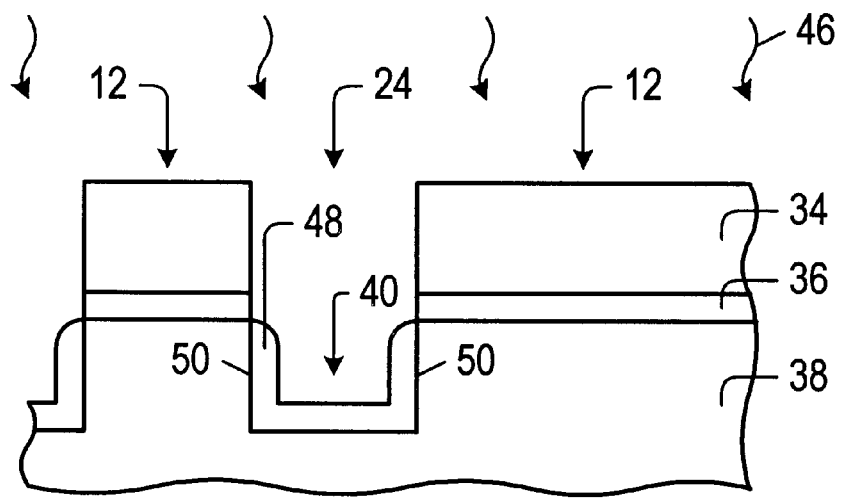
FIG. 5 represents a processing step showing thermal growth of a thin oxide layer lining the trench.

The aforedescribed processing steps may be performed in various processing chambers. For example, pad oxide 36 may have been grown in a thermal oxidation furnace, nitride layer 34 may have been deposited in a chemical vapor deposition (CVD) chamber. Furthermore, either dry plasma chambers or wet etch chambers or a combination thereof may be employed for the various removing processes, such as forming trench 40 in trench region 24. The following processing steps are advantageously performed substantially in situ, in a single processing chamber, as described below. In a preferred embodiment, the processing steps of FIGS. 5–7 are performed in situ. However, in alternative embodiments other ones of the processing steps described supra and infra may be performed in situ in a processing chamber is adapted therefore and as described for FIGS. 10–12, infra.

FIG. 5 illustrates a processing step performed subsequent to that of FIG. 4. A thin oxide 48 is thermally grown on the surfaces of trench 40. The thin oxide 48 may be formed in an oxidizing ambient, and in the presence of thermal energy shown by reference numeral 46. Thin oxide 48 may be grown according to a rapid thermal anneal (RTA) process.

The combination of an oxidizing ambient and thermal energy causes oxide to grow upon the trench walls 50 and the floor of the trench where the silicon substrate 38 and active region sidewalls 50 are exposed. The nitride layer 34 is substantially oxygen impermeable and thus prevents any significant additional oxide growth on the top surfaces of active regions 12. Thin oxide 48 passivates the active region sidewalls 50 to provide protection during subsequent processing steps. Moreover, grown oxide 48 terminates dangling bonds resulting from the etch cycle.

Figure 6A:
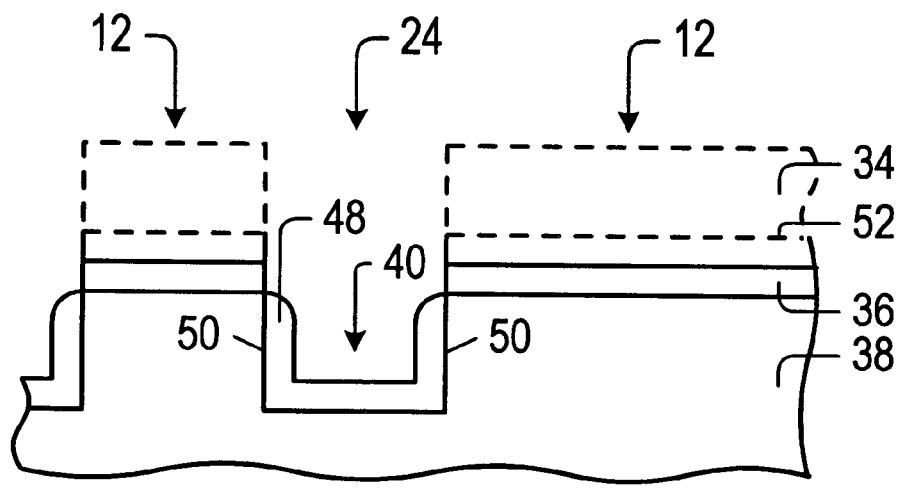
FIG. 6a represents a processing step showing the removal of some or all of the nitride layer, but leaving substantially all of the pad oxide layer.
Figure 6B:
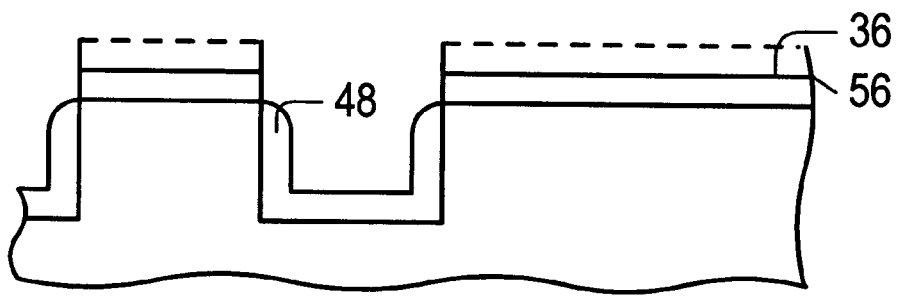
FIG. 6b represents an alternative processing step to that of FIG. 6a, showing the removal of all of the nitride layer and some of the pad oxide layer.
Figure 7:
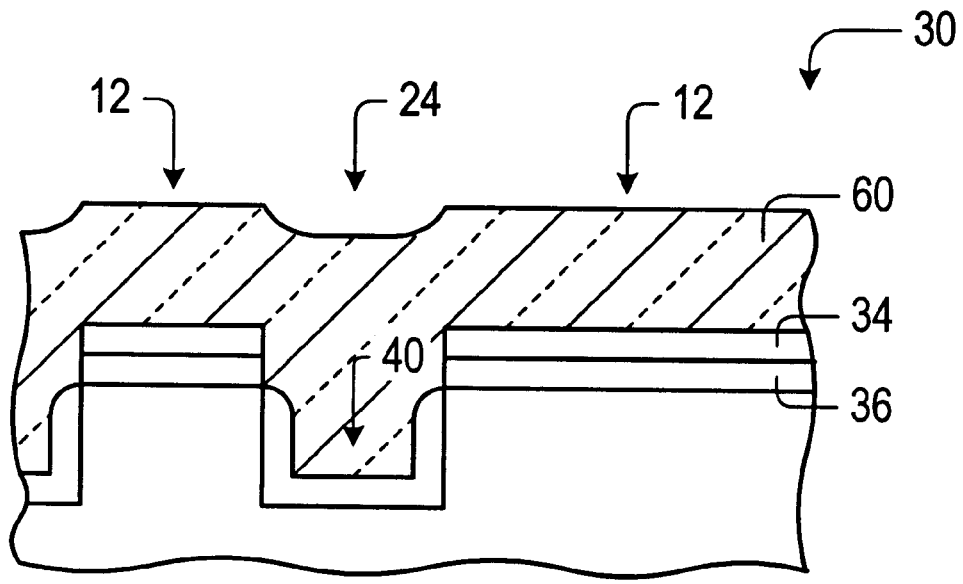
FIG. 7 represents a processing step showing the deposition of a fill dielectric in and over the trenches and active regions.

FIGS. 6a and 6b illustrate a processing step performed subsequent to that of FIG. 5. Nitride layer 34 is completely or partially removed. Nitride layer 34 may be removed by a selective wet etch process, such as hot phosphoric acid. Preferably, a dry plasma etch may be used. Less selective plasma etches may be used since the oxide 48 lining trench 40 serves to protect the active region sidewalls 50. Furthermore, the wet etch may contain many contaminants harmful to device performance and involves a cumbersome wet chemistry. A plasma etch is a cleaner, less cumbersome process and will not harm the active regions 12 since a protective trench lining oxide 48 was grown in the processing step of FIG. 5.

FIG. 6a illustrates two embodiments of the processing step of removing nitride layer 34. As shown in FIG. 6a, nitride layer 34 may be removed to a level indicated by reference numeral 52 so that only a thin layer of nitride layer 34 remains. Alteratively, nitride layer 34 may be substantially completely removed so that only the pad oxide layer 36 remains.

FIG. 6b illustrates a third embodiment of the processing step of removing nitride layer 34. In this embodiment, nitride layer 34 is completely removed and a portion of pad oxide layer 36 is removed. Pad oxide layer 36 may be removed to an elevational level as indicated by reference numeral 56. Note that although not shown in FIG. 6b, some of trench lining oxide 48 may also be removed during this process.

Turning now to FIG. 7, a processing step is shown whereby a fill dielectric 60 is deposited upon semiconductor topography 30, filling trench region 24 and covering active regions 12 and trench region 24. Fill dielectric 60 is preferably an LPCVD-deposited tetraethoxysilane (TEOS) or an atmospheric-pressure ozone-TECS material blanket deposited across the entire wafer topography. The process may include vaporizing the TEOS and then condensing the vaporized TEOS within trench 40 and across active regions 12 and trench region 24. It is understood that fill dielectric 60 may comprise several applications of dielectric material (preferably oxide) in order to fill trench regions 24 and cover semiconductor topography 30. FIG. 7 illustrates an embodiment in which a portion of nitride layer 34 and all of pad oxide layer 36 remain and are covered by fill dielectric 60. It is understood that the processing step of FIG. 7 may be practiced with any of the embodiments as described in FIGS. 6a and 6b.

Figure 8:
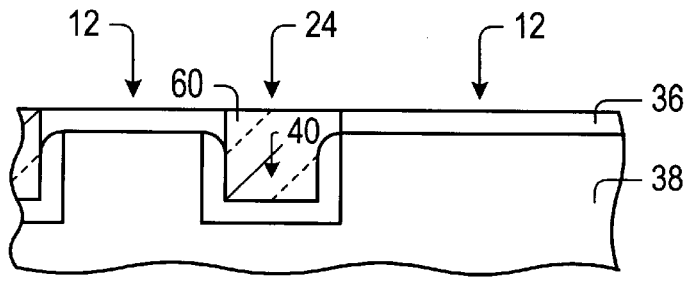
FIG. 8 represents a processing step showing the removal of the upper portion of the fill dielectric to planarize the upper surface and wherein the trenches remain filled with the dielectric.

Turning now to FIG. 8, a planarization step is illustrated which occurs subsequent to the step shown in FIG. 7. More specifically, fill dielectric 60 is partially removed at its upper regions to an elevational level slightly above active regions 12 and trench region 24. Fill dielectric is preferably removed to an elevational level below any recesses in the upper surface of fill dielectric 60 so that a substantially planar surface is formed. Planarization is preferably performed using chemical-mechanical polishing (CMP). CMP is effective in producing a substantially planar surface. A chemical slurry and a slightly abrasive pad are used in conjunction to remove the fill dielectric in the CME process. Alternatively an etch process, such as a plasma etch, may be used to remove the upper fill dielectric 60 for planarization. The etch process may involve a sacrificial layer planarized upon fill dielectric 60, which is removed at approximately the same etch rate as that used to remove fill dielectric 60.

The remaining nitride layer 34 and pad oxide 36 act as a polish or etch stop and protect the surface of active regions 12 during the planarization process. FIG. 8 shows an embodiment where all of nitride layer 34 has been removed during planarization, but a portion of pad oxide layer 36 remains. Note also that trench 40 remains completely filled with fill dielectric 60, thereby forming an isolation region between active regions 12.

Figure 9:
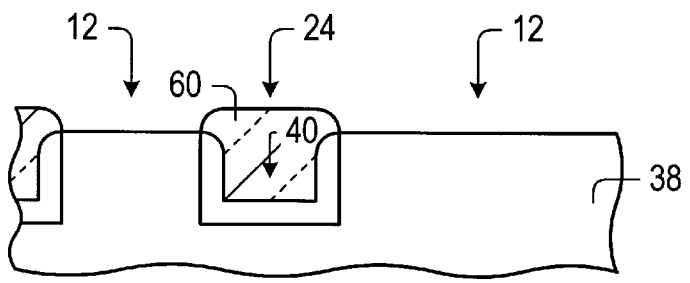
FIG. 9 represents a process step showing the removal of the remaining pad oxide layer to provide a clean surface upon which a gate oxide can subsequently be grown.

Turning now to FIG. 9, a processing step subsequent to that of FIG. 8 is illustrated. FIG. 9 shows removal of the remaining pad oxide layer 36. A wet etch process may be used to remove the remaining pad oxide layer 36. Trench 40 remains filled with fill dielectric 60. Removal of remaining pad oxide layer 36 is performed to provide a clean surface on active regions 12 for the subsequent growth of a gate oxide layer and other process steps to create semiconductor devices as illustrated in FIG. 1. Conventional processes may be utilized. For example, FIG. 9 may be followed by processing steps to further define isolation regions and device regions, grow gate oxide, form polysilicon gate structures, implant source/drain regions, etc.

Figure 10:
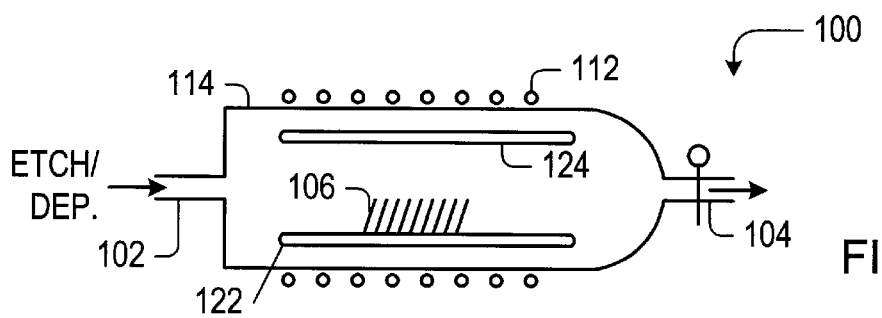
FIG. 10 is an illustration of a process tube adapted for in situ processing of multiple ones of the above illustrated processing steps.
Figure 11:
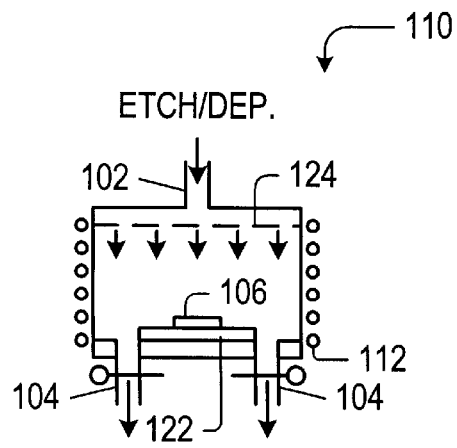
FIG. 11 is an illustration of a reaction chamber adapted for in situ processing of multiple ones of the above illustrated processing steps.
Figure 12:
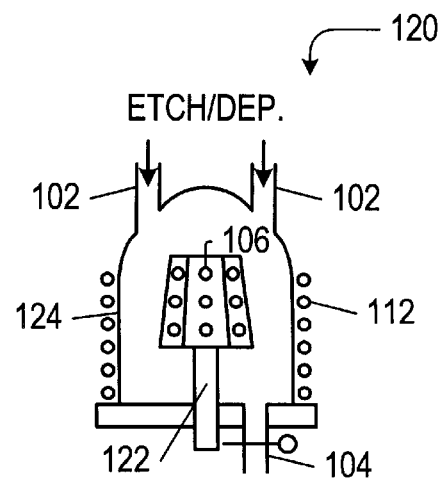
FIG. 12 is an illustration of a barrel reactor adapted for in situ processing of multiple ones of the above illustrated processing steps.

FIGS. 10–12 are exemplary of various types of processing chambers adapted for in situ processing according to the present invention.

FIG. 10 illustrates a diffusion or thermal oxidation furnace 100 adapted as an in situ reaction chamber for processing multiple ones of the aforedescribed processing steps in a single chamber according to the present invention. The in situ chamber 100 comprises a tubular reaction chamber 114 for processing wafers 106. Wafers 106 may be received on wafer carrier 122. Wafers may be arranged substantially perpendicular to the gas flow, as shown, or alternatively, substantially parallel to the gas flow. Chamber 100 also includes an inlet port 102 adapted to provide either oxygen, a deposition gas, or an etchant into the reaction chamber 114. An external mechanism may be provided for supplying either oxygen, etchant gas, or deposition gas, as desired, through inlet port 102. Outlet port 104 provides a means to exhaust the deposition or etchant gas from reaction chamber 114 between processing steps. For example, oxygen may first be supplied to reaction chamber 114 for the processing step of FIG. 5. Oxygen is then removed and an etchant gas may be supplied for the processing step of FIGS. 6a or 6b. Next the etchant gas may be removed and TEOS supplied for the processing step of FIG. 7. Outlet port 104 may be coupled to a vacuum supply.

Furthermore, between some or each of the processing steps, a purge cycle, which may include the use of any gas suitable for purging, may be run through reaction chamber 114 to remove the gaseous material from the processing step. In situ chamber 100 may also include a thermal energy source 112 adapted to provide thermal energy during some of the processing steps such as the oxide growth steps. Thermal energy source 112 may be a heating coil extending at least partially around the chamber. Alternatively, the thermal source may be located within chamber 114. For example, wafer holder 122 may be adapted to include a heating element. Furthermore, in situ chamber 100 may include electrodes 122 and 124 for forming a plasma during plasma etch processing steps, such as in FIGS. 6a or 6b. A portion of the wafer holder 122 may be modified to serve as one electrode. Furthermore, in situ chamber 100 may be adapted for atmospheric, low pressure, or high pressure processing.

FIG. 11 illustrates another example according to the present invention of a conventional processing chamber modified for in situ processing. In situ chamber 110 may be an anneal chamber modified for in situ thermal growth, etchant, and thin film deposition processing steps as described for FIGS. 5–7 above. Similarly as described for in situ chamber 100, chamber 110 may include inlet port 102 and exhaust manifold 104 adapted for controlling the flow of gases for oxide growth, etching, and chemical vapor deposition. Exhaust manifold 104 may be coupled to a vacuum supply. Chamber 112 may include thermal source 112 and may also be adapted to include plasma electrodes 122 and 124, wherein wafer holder 122 has been modified to serve as an electrode. In general, chamber 1 10 is adapted for in situ processing of thermal growth, etching, and deposition processes.

FIG. 12 illustrates another example according to the present invention of a conventional processing chamber modified for in situ processing. In situ chamber 120 may be a barrel CVD chamber modified for in situ thermal growth, etchant, and thin film deposition processing steps as described for FIGS. 5–7 above. Similarly as described for in situ chambers 100 and 110, chamber 120 may include inlet manifold 102 and exhaust port 104 adapted for controlling the flow of gases for oxide growth, etching, and chemical vapor deposition. Exhaust port 104 may be coupled to a vacuum supply. Chamber 120 may include thermal source 112 and may also be adapted to include plasma electrodes 122 and 124. For example, wafer holder 122 may be adapted to supply RF power as the positive plasma electrode and chamber walls 124 may be adapted to serve as the ground electrode, for example, by grounding the chamber wall shielding. In general, chamber 120 is adapted for in situ processing of thermal growth, etching, and deposition processes.

The present invention encompasses adaptations of conventional processing chambers to function as in situ processing chambers for thermal growth, etch, and deposition processes. It is her contemplated by the present invention that the chamber may be further modified to provide for additional processing steps as describe for FIGS. 1–9, supra. Furthermore, instead of modifying conventional processing chambers, a specialized chamber may be employed that provides for in situ processing of thermal growth, etch, and deposition processes as described above.

It will be appreciated to those skilled in the art having the benefit of this disclosure that this invention is capable of applications with numerous types of numerous semiconductor processes for creating integrated circuits. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:

providing a semiconductor substrate having a trench extending into the substrate adjacent a surface of the substrate covered by a substantially oxygen impermeable layer;

within a common chamber and without opening the chamber, performing the steps of:
growing an oxide upon a surface of the trench;
removing the substantially oxygen impermeable layer; and
depositing a dielectric within the trench,
wherein said growing occurs before said removing, and said removing occurs before said depositing, and wherein said growing, removing and depositing occurs without opening the chamber intermediate said growing, removing and depositing steps.

2. The method as recited in claim 1, wherein said trench extends into the substrate from the surface of said substrate in regions absent said substantially oxygen impermeable layer.

3. The method as recited in claim 1, wherein said growing comprises heating said substrate in the presence of oxygen.

4. The method as recited in claim 1, wherein said removing comprises subjecting the substantially oxygen impermeable layer to a plasma etchant.

5. The method as recited in claim 1, wherein said depositing comprises applying a silicon dioxide.

6. The method as recited in claim 5, wherein said applying comprises vaporizing tetraethoxysilane (TEOS) and then condensing the vaporized TEOS within the trench to a thickness which exceeds a depth of the trench.

7. The method as recited in claim 1, wherein the semiconductor substrate remains within the chamber throughout the growing, removing and depositing steps.

* * * * *